US008489971B1

(12) United States Patent
Chan et al.

(10) Patent No.: US 8,489,971 B1
(45) Date of Patent: Jul. 16, 2013

(54) HARDWARE IMPLEMENTATION SCHEME TO ADAPT COEFFICIENTS FOR DATA DEPENDENT NOISE PREDICTION AND SOFT OUTPUT VITERBI ALGORITHM

(75) Inventors: Kai Keung Chan, Fremont, CA (US); Kin Man Ng, Cupertino, CA (US); Xin-Ning Song, San Jose, CA (US); Jason Bellorado, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 120 days.

(21) Appl. No.: 13/117,955

(22) Filed: May 27, 2011

Related U.S. Application Data

(60) Provisional application No. 61/396,558, filed on May 28, 2010.

(51) Int. Cl.
*H03M 13/03* (2006.01)
(52) U.S. Cl.
USPC .......................................... 714/795
(58) Field of Classification Search
USPC .......................................... 714/795
See application file for complete search history.

(56) References Cited

U.S. PATENT DOCUMENTS

| 5,933,462 | A | * | 8/1999 | Viterbi et al. | 375/341 |
| 6,023,783 | A | * | 2/2000 | Divsalar et al. | 714/792 |
| 7,257,172 | B2 | * | 8/2007 | Okamoto et al. | 375/341 |
| 8,074,152 | B2 | * | 12/2011 | Oh et al. | 714/784 |
| 2008/0276156 | A1 | | 11/2008 | Gunnam et al. | |
| 2008/0301521 | A1 | | 12/2008 | Gunnam et al. | |
| 2008/0313692 | A1 | * | 12/2008 | Yun et al. | 725/131 |
| 2009/0125793 | A1 | * | 5/2009 | Kishigami et al. | 714/794 |
| 2009/0296842 | A1 | * | 12/2009 | Papadopoulos et al. | 375/260 |

OTHER PUBLICATIONS

Lin Fang; Milstein, L.B.; , "Performance of successive interference cancellation in convolutionally coded multicarrier DS/CDMA systems," Communications, IEEE Transactions on , vol. 49, No. 12, pp. 2062-2067, Dec. 2001.*
Wan-Jin Kim; Young-Jun Lee; Hyoung-Nam Kim; Hyoungsoo Lim; Jong Soo Lim; , "Coded Decision-Directed Channel Estimation for Coherent Detection in Terrestrial DMB Receivers," Consumer Electronics, IEEE Transactions on , vol. 53, No. 2, pp. 319-326, May 2007.*

* cited by examiner

*Primary Examiner* — Cynthia Britt
(74) *Attorney, Agent, or Firm* — Van Pelt, Yi & James LLP

(57) ABSTRACT

A system for adapting coefficients of a soft output Viterbi algorithm (SOVA) is disclosed. The system includes a receiver configured to select an output of an SOVA detector at least in part based on a criterion. The receiver is configured to store the selected output of the SOVA detector. The receiver is further configured to store a signal that corresponds to the stored selected output of the SOVA detector, wherein the input to the SOVA detector is derived from the signal. The receiver is further configured to adapt a plurality of coefficients of the SOVA detector at least in part based on the stored selected output of the SOVA detector, the stored signal, and a corresponding data pattern. The system includes an interface coupled to the receiver and configured to receive samples.

31 Claims, 4 Drawing Sheets

HARDWARE IMPLEMENTATION SCHEME TO ADAPT COEFFICIENTS FOR DATA DEPENDENT NOISE PREDICTION AND SOFT OUTPUT VITERBI ALGORITHM

CROSS REFERENCE TO OTHER APPLICATIONS

This application claims priority to U.S. Provisional Patent Application No. 61/396,558 entitled HARDWARE IMPLEMENTATION SCHEME TO ADAPT COEFFICIENTS FOR DATA DEPENDENT NOISE PREDICTION AND SOFT OUTPUT VITERBI ALGORITHM filed May 28, 2010 which is incorporated herein by reference for all purposes.

BACKGROUND OF THE INVENTION

Low-density parity-check (LDPC) codes are a type of error correcting code. LDPC codes are becoming increasingly popular for encoding data that is written to storage media, such as hard disk drives or flash drives. It would be desirable to develop performance enhancing techniques for LDPC storage applications.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
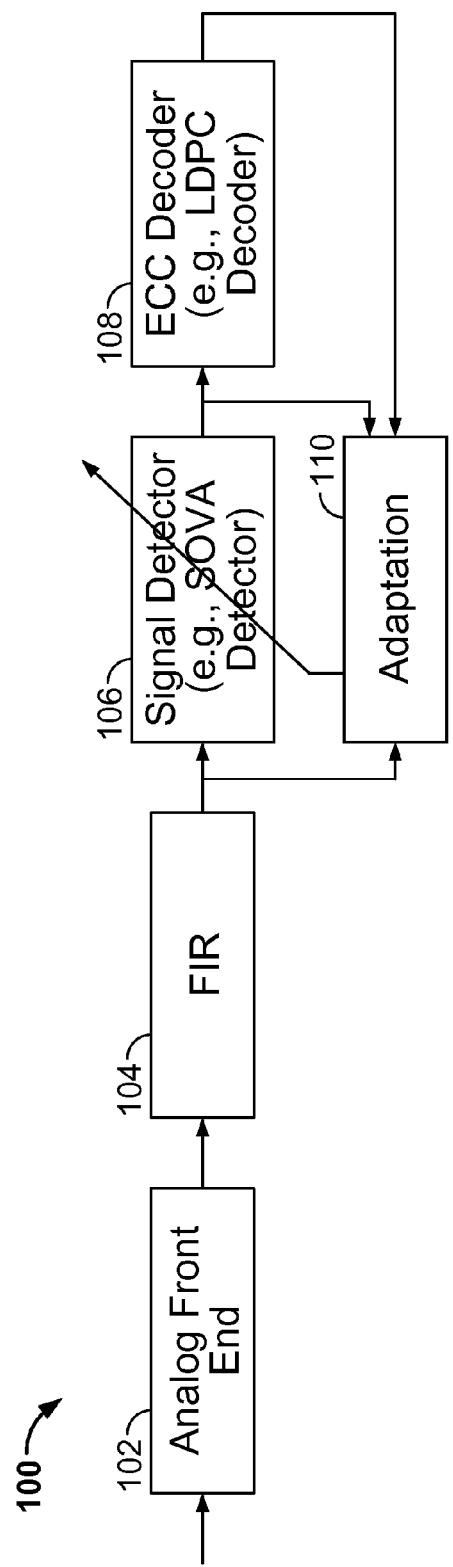
FIG. 1 is a block diagram illustrating an embodiment of a receiver system 100.

FIG. 1 is a block diagram illustrating an embodiment of a receiver system 100. In some embodiments, receiver system 100 is used to read data from storage media (e.g., flash storage or magnetic disk storage). In some other embodiments, the techniques described herein are used in a communication system and are implemented in a wired or wireless receiver.

As shown in FIG. 1, receiver system 100 includes an analog front end (AFE) 102. The output of AFE 102 is passed to a finite impulse response (FIR) filter 104. In some embodiments, FIR filter 104 is an equalizer, and equalized samples from FIR filter 104 are fed as input into a signal detector 106. The output of signal detector 106 is then fed as input into an error-correcting code (ECC) decoder 108.

In some embodiments, signal detector 106 is a soft decision decoder providing soft information to ECC decoder 108. For example, signal detector 106 may be implemented using a soft output Viterbi algorithm (SOVA). In other examples, signal detector 106 is implemented using a Max-Log-MAP algorithm or MAP algorithm.

In some embodiments, the soft information output from signal detector 106 is the probability of a sample being a particular symbol. For example, if the samples are bit-based, then the symbols are either zero or one, i.e., the symbols form a Galois field of 2, GF(2), and thus, $$Pr(\text{sample}==1) + Pr(\text{sample}==0) = 1$$

The soft information may be represented in a log-likelihood ratio (LLR), which is defined by the following equation:

$$LLR(c_i) = \log\left(\frac{Pr(c_i = 0 | \text{channel output for } c_i)}{Pr(c_i = 1 | \text{channel output for } c_i)}\right)$$

where $c_i$ is the $i^{th}$ bit of the transmitted codeword, $c_i$.

The LLR values are fed as input to ECC decoder 108. In some embodiments, ECC decoder 108 is a low-density parity-check (LDPC) decoder. In various embodiments, LDPC decoder 108 may be implemented using various algorithms, including the sum-product algorithm, the min-sum algorithm, and the belief propagation algorithm.

The coefficients of SOVA detector 106 can be adapted using different techniques. One technique is to feed the hard decisions from SOVA detector 106 back to an adaptation block for SOVA coefficient adaptation. However, this technique has its drawbacks. For example, when receiver system 100 is operating under a low signal-to-noise ratio (SNR)

environment, the hard decisions from SOVA detector 106 may have such a high bit error rate (BER) that the feedback loops adapting the SOVA coefficients become unstable.

Referring back to FIG. 1, a second technique is to feed the decisions from ECC decoder 108 back to an adaptation block 110 for SOVA coefficient adaptation. In this technique, besides the output of ECC decoder 108, the output of FIR filter 104 and different outputs of SOVA detector 106 (e.g., hard decisions and reliability values) are also used to adapt the coefficients of SOVA detector 106. However, this technique also has its drawbacks. Some ECC decoders have long and/or variable decoding latency. For example, LDPC uses an iterative decoding scheme and, as a result, the decoding latency is variable and relatively long compared to other types of ECC decoding. Since the outputs of both FIR filter 104 and SOVA detector 106 need to be buffered commensurate with the decoding latency associated with ECC decoder 108, a long and variable decoding latency translates to increased buffer sizes and thus increased hardware implementation cost. Therefore, improved techniques for adapting the coefficients of SOVA detector 106 are desirable.

Figure 2:
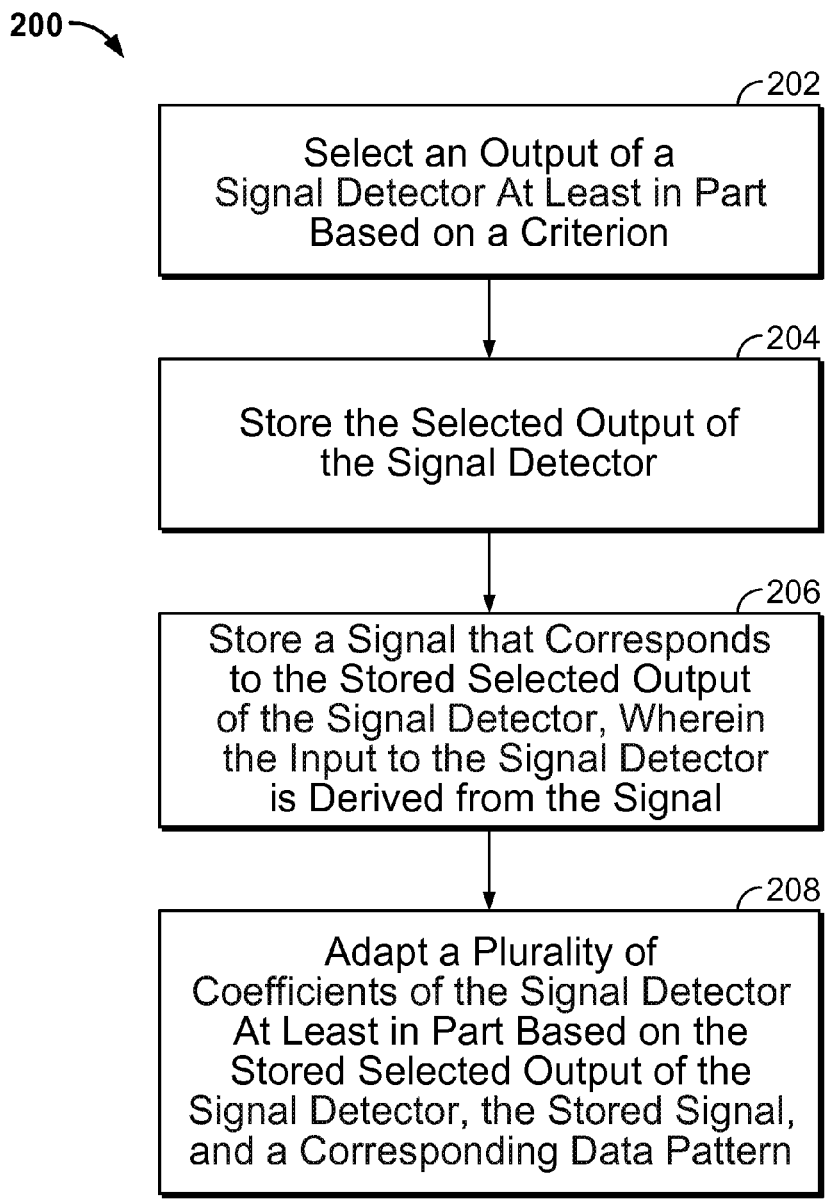
FIG. 2 is a flow chart illustrating an embodiment of a process 200 for adapting the coefficients of a signal detector, e.g., a SOVA detector.

FIG. 2 is a flow chart illustrating an embodiment of a process 200 for adapting the coefficients of a signal detector, e.g., a SOVA detector. At 202, an output of the signal detector is selected at least in part based on a criterion. For example, the output of the signal detector is a reliability value, and the criterion is a user-programmable criterion. Because only some of the reliability values of the signal detector satisfy the criterion, the amount of storage required for storing the reliability values of the signal detector is reduced, thereby reducing hardware implementation cost. In some embodiments, the criterion also selects only those reliability values from the signal detector that can be used to adapt the coefficients of the signal detector reliably. At 204, the selected output of the signal detector is stored. For example, the selected output of the signal detector may be stored in a queue or in other types of data structures. At 206, a signal that corresponds to the stored selected output of the signal detector is stored. In some embodiments, this stored signal is an input signal to the signal detector. In some other embodiments, this stored signal is an input signal to an FIR filter, which equalizes or pulsed-shapes the input signal to a target response. The output of the FIR filter is then fed as an input signal to the signal detector. At 208, a plurality of coefficients of the signal detector is adapted at least in part based on the stored selected output of the signal detector, the stored signal, and a corresponding data pattern. In some embodiments, the corresponding data pattern is a data pattern decoded by an ECC decoder. In some embodiments, intermediate or partial results from the ECC decoder may be used as the data pattern. For example, if a part of a sector satisfies parity-check while the overall sector does not, then the intermediate and partially reliable decoded data may be used as the data pattern. In some other embodiments, the corresponding data pattern is a known data pattern for receiver training purposes.

Figure 3:
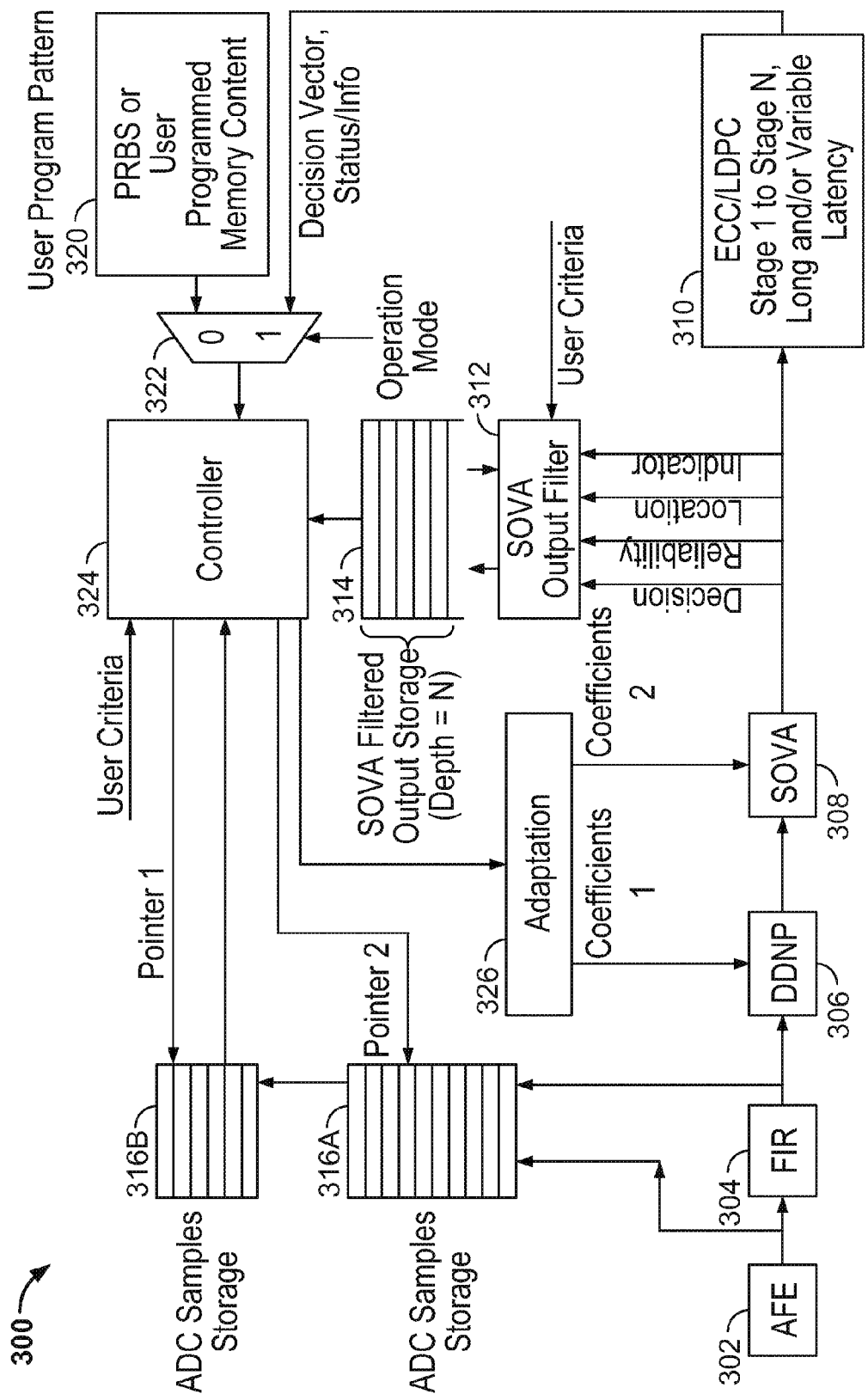
FIG. 3 is a block diagram illustrating an embodiment of a receiver system 300.

FIG. 3 is a block diagram illustrating an embodiment of a receiver system 300. As shown in FIG. 3, receiver system 300 includes an AFE 302. The output of AFE 302 is passed to an FIR filter 304. Equalized and pulse-shaped samples from FIR filter 304 are fed as input into a data-dependent noise prediction (DDNP) module 306. The output of DDNP module 306 is in turn fed as input into a SOVA detector 308. The soft information output (e.g., LLR values) from SOVA detector 308 is then fed as input to an LDPC decoder 310. In some embodiments, FIR filter 304 and DDNP module 306 are optional. For example, the output of AFE 302 may be fed as input into SOVA detector 308.

With continued reference to FIG. 3, a SOVA output filter 312 is coupled to the SOVA detector 308. SOVA output filter 312 monitors the various outputs (e.g., hard decisions, soft decisions, and reliability values) of SOVA detector 308. In some embodiments, new outputs from SOVA detector 308 are available after each clock cycle, and SOVA output filter 312 monitors the outputs from SOVA detector 308 only once every multiple clock cycles. This sub-sampling scheme reduces hardware implementation cost.

SOVA output filter 312 monitors one or more of the various outputs (e.g., hard decisions, soft decisions, and reliability values) of SOVA detector 308 and selectively stores some of the outputs of SOVA detector 308 in a SOVA filtered output storage (e.g., a queue) 314 based on one or more criteria. In some embodiments, the one or more criteria are user-programmable criteria. For example, a user may program the types of output of SOVA detector 308 that are monitored by SOVA output filter 312 as well as the criteria for determining whether the monitored outputs should be stored.

SOVA filtered output storage 314 can be implemented with any suitable data structures, including queues, arrays, linked lists, buffers, stacks, and the like. SOVA filtered output storage 314 can be an internal storage or an external storage. In some embodiments, SOVA filtered output storage 314 is a queue with a finite depth of N. In magnetic recording systems, a sector is a subdivision of a track on a magnetic disk; a sector may have thousands of samples. In some embodiments, N is a small fraction of the number of samples in a sector.

Different types of SOVA detector output can be monitored and selectively stored by SOVA output filter 312. In some embodiments, reliability values of SOVA detector 308 are monitored and selectively stored. Reliability values measure the reliability of the decisions of SOVA detector 308. One type of reliability value is a path metric difference ($\Delta$) between two paths. For example, the reliability value may be a $\Delta$ between a most-likely (ML) path, $\alpha$, and a second-ML path, $\beta$, as will be described in greater detail below. The reliability value may also be a $\Delta$ between a first path and its next-ML path. For example, the reliability value may be a $\Delta$ between a second-ML path and a third-ML path. Another type of reliability value is the LLR value from SOVA detector 308.

Figure 4:
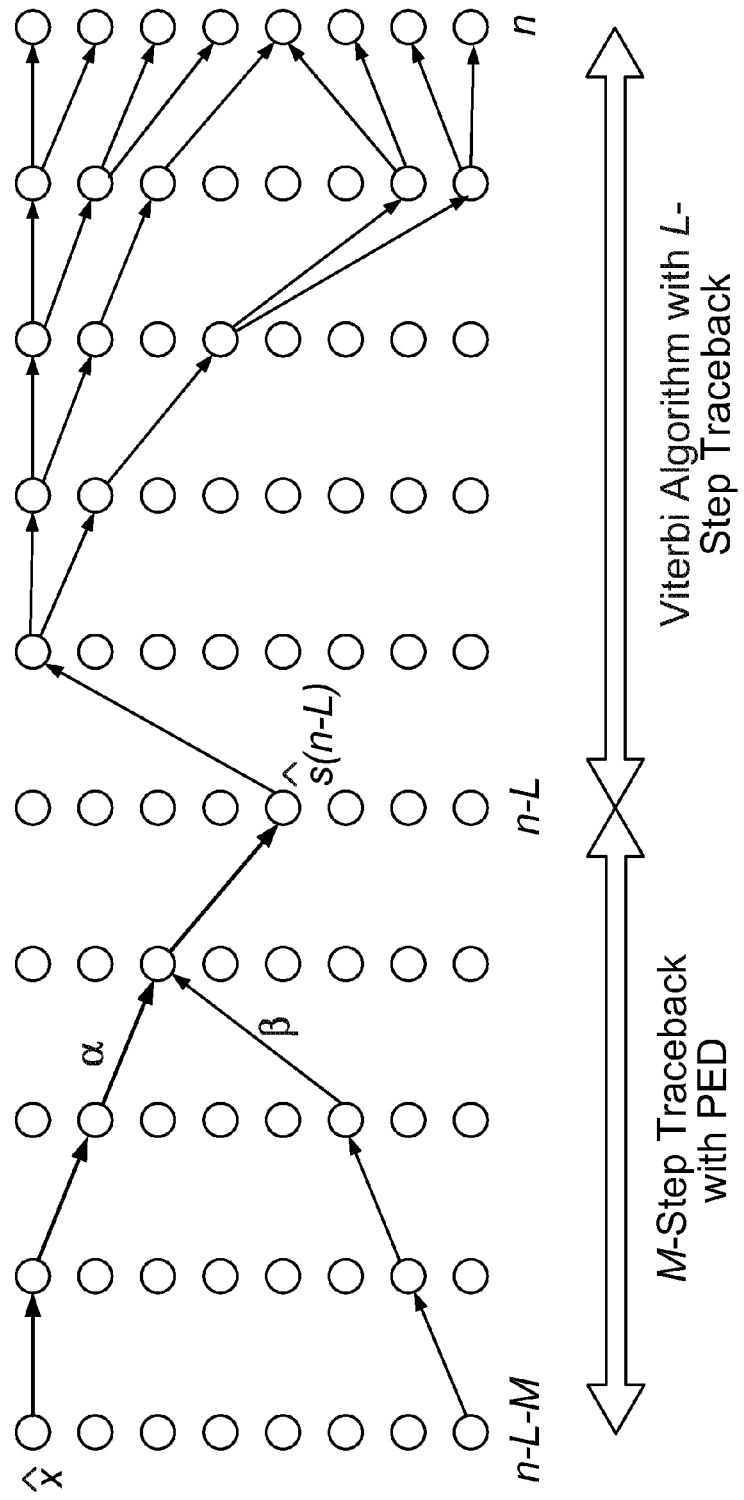
FIG. 4 is a diagram illustrating an embodiment of a traceback in SOVA detector 308 to determine the two ML paths, $\alpha$ and $\beta$.

FIG. 4 is a diagram illustrating an embodiment of a traceback in SOVA detector 308 to determine the two ML paths, $\alpha$ and $\beta$. In some embodiments, SOVA detector 308 uses a two-stage procedure to determine the two ML paths. The right section of FIG. 4 shows that $\alpha$ is determined using the regular Viterbi algorithm with an L-step traceback. For example, add-compare-select (ACS) structures may be used to perform path selection at each iteration of the algorithm. Each ACS outputs the difference in path metrics between the pair of competing paths. As shown in FIG. 4, the hard decision, $\hat{x}$, is based on the ML path, $\alpha$.

As shown in FIG. 4, a second-stage traceback uses a path-equivalence detector (PED) to determine the equivalence between each pair of competing decisions obtained through a k-step traceback from nodes along the ML path, where $k \in [1, 2, \ldots, M]$. A reliability measure unit (RMU) is further employed to resolve the minimum difference in competing path metrics. The result is the second-ML path, $\beta$, which reflects the complementary bit decision, $\bar{x}$.

Referring back to FIG. 3, in some embodiments, the path metric difference ($\Delta$) between the most-likely (ML) path, $\alpha$, and the second-ML path, $\beta$, is monitored and selectively stored by SOVA output filter 312. In some embodiments, the hard decision, $\hat{x}$, based on the ML path as described above is monitored and selectively stored by SOVA output filter 312.

Smaller reliability values (e.g., smaller path metric differences) indicate that the decisions made by SOVA detector 308 are less reliable. In some embodiments, the criterion for determining whether the monitored reliability values should be stored is based on a user-defined threshold. For example, if a reliability value is smaller than a user-defined threshold, then the reliability value and the information associated with the reliability value are stored in SOVA filtered output storage 314. In some embodiments, the information associated with the reliability value includes locations or regions within a sector, probable error events, and indicators (e.g., PEDs).

Whenever the monitored SOVA detector output is captured into SOVA filtered output storage 314, a signal that corresponds to the stored SOVA detector output (see step 206 of process 200) is stored in an ADC samples storage 316. This signal is hereafter referred to as the ADC samples. As will be described in greater detail below, the ADC samples that correspond to the stored SOVA detector output can be used in conjunction with the stored SOVA detector output, the information associated with the SOVA detector output, and the corresponding LDPC decoder output for adapting the coefficients of the DDNP module 306 and SOVA detector 308.

With continued reference to FIG. 3, in some embodiments, the ADC samples are samples obtained from the output of AFE 302. In some embodiments, the ADC samples are samples obtained from the output of FIR filter 304.

In some embodiments, ADC samples storage 316 is a local memory configured to store the ADC samples with a copy operation. In some embodiments, ADC samples storage 316 is a circular buffer. In some embodiments, ADC samples storage 316 can be further divided into two sections—a bigger section 316A and a smaller section 316B. ADC samples are first copied to the bigger section, and a subset of the samples can be moved to the smaller section that can be locked from write access. In this way, only a small section of storage 316 needs to be locked at a time.

Note that SOVA filtered output storage 314 has a limited size. If SOVA filtered output storage 314 is full, a new SOVA detector output that satisfies the specified criterion can be compared with entries already in storage 314 and be used to replace one of the entries, if the new output can provide better adaption for the coefficients of the DDNP module 306 and SOVA detector 308 than the replaced entry. For example, if storage 314 is a queue with a queue depth of 32 and the queue is already full, then a new reliability value that is smaller than the user-defined threshold can be compared with all of the 32 existing reliability values in the queue and be used to replace the largest of them if the new reliability value is smaller than that largest existing reliability value.

Controller 324 has access and control of SOVA filtered output storage 314 and ADC samples storage 316. In addition, controller 324 receives decoded data pattern from LDPC decoder 310. Since the decoded data pattern from LDPC decoder 310 has a decoding latency, controller 324 is configured to synchronize the received decoded data pattern from LDPC decoder 310 with its corresponding set of ADC samples and its corresponding set of SOVA filtered output, and then pass all of this information to an adaptation module 326 for adapting the coefficients of DDNP module 306 and SOVA detector 308, respectively.

In various embodiments, one or more of: controller 324, SOVA output filter 312, and filtered output storage 314 are configured to manage SOVA filtered output storage 314, including for example, which values are stored in storage 314 and which values are overwritten.

In some embodiments, instead of using the decoded data pattern from LDPC decoder 310, a known data pattern may be used to adapt the coefficients of DDNP module 306 and SOVA detector 308. This may be useful for training the DDNP module 306 and SOVA detector 308 during the manufacturing stage. For example, after training, the coefficients may be stored as default coefficients for initializing the coefficients of DDNP module 306 and SOVA detector 308.

In some embodiments, the known data pattern can be a self-generated pattern, such as a pseudo-random binary sequence (PRBS) or a user-programmed data pattern. If a user-programmed data pattern is used, it can reside in a data buffer of LDPC decoder 310 when LDPC decoder 310 is not doing any decoding at the time, thus reducing the amount of hardware required. Note that the user-programmed data pattern is not limited to PRBS type patterns only. For example, the user may choose to use a data pattern with certain desirable system properties.

Under some conditions, controller 324 may be configured to discard some of the entries in SOVA filtered output storage 314. For example, when the SNR for a particular sector is very low, the BER increases and ECC decoder 310 may require more iterations to decode the data, thus increasing the decoding latency. When the decoding latency becomes too long, the adaptation of the coefficients of DDNP module 306 and SOVA detector 308 is blocked and the performance of DDNP module 306 and SOVA detector 308 would suffer. Under such conditions, controller 324 may discard the SOVA filtered output entries corresponding to the sector based on a user-programmed criterion. This can "un-block" the adaptation of the coefficients of DDNP module 306 and SOVA detector 308 such that faster adaptation of the coefficients may be achieved. Faster adaptation can lead to faster convergence of the coefficients and is advantageous during real time operation.

For example, if ECC decoder 310 takes too long to decode sector n, controller 324 may discard the SOVA filtered output entries corresponding to sector n and use the entries corresponding to sector (n+1) instead for coefficient adaptation. In some other embodiments, controller 324 may use the SOVA filtered output entries out of order. For example, controller 324 may use the entries corresponding to sector (n+1) before the entries corresponding to sector n.

In some embodiments, controller 324 may discard or re-order some of the SOVA filtered output entries based on a status or an intermediate result of ECC decoder 310. For example, if an error detection code (EDC) is used in ECC decoder 310, some of the SOVA filtered output entries may be discarded or re-ordered based on an EDC failure status.

In some embodiments, controller 324 may discard or re-order some of the SOVA filtered output entries based on the soft information output (e.g., LLR values) from SOVA detector 308. For example, many small LLR values within a sector may be useful for predicting an uncorrectable sector or a long decoding latency. Therefore, controller 324 may discard or re-order some of the SOVA filtered output entries without waiting for a long decoding latency is detected.

In some embodiments, controller 324 may also be configured not to discard the SOVA filtered output. For example, if a particular sector is uncorrectable, the discard policy can be configured to use the uncorrectable sector for retry operations.

In the above examples, controller 324 implements the discard policy. However, the discard policy may be implemented by SOVA filtered output storage 314 or other controllers as well.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for adapting values of coefficients of a soft output Viterbi algorithm (SOVA) detector, comprising:
a receiver configured to:
select an output of an SOVA detector at least in part based on a criterion;
store the selected output of the SOVA detector;
store a signal that corresponds to the stored selected output of the SOVA detector, wherein the input to the SOVA detector is derived from the signal; and
adapt values of a plurality of coefficients of the SOVA detector at least in part based on the stored selected output of the SOVA detector, the stored signal, and a corresponding decoded data pattern; and
an interface coupled to the receiver and configured to receive an input to the receiver from which the signal is derived.

2. The system of claim 1, wherein the output of the SOVA detector comprises a hard decision.

3. The system of claim 1, wherein the output of the SOVA detector comprises a reliability value.

4. The system of claim 3, wherein the reliability value comprises a path metric difference between a first path and a second path.

5. The system of claim 4, wherein the second path is a next-ML path of the first path.

6. The system of claim 3, wherein selecting at least in part based on the criterion comprises selecting the reliability value in the event that the reliability is below a predetermined threshold.

7. The system of claim 3, wherein selecting at least in part based on the criterion comprises:
selecting the reliability value in the event that the reliability is below a predetermined threshold and further that the reliability value is below at least one previously stored reliability value; and
permitting the at least one previously stored reliability value to be overwritten.

8. The system of claim 1, further comprising storing a location value that corresponds to the stored selected output of the SOVA detector.

9. The system of claim 8, wherein adapting the values of the plurality of coefficients of the SOVA detector further comprises adapting the values of the plurality of coefficients at least in part based on the location value.

10. The system of claim 1, further comprising storing an indicator value that corresponds to the stored selected output of the SOVA detector.

11. The system of claim 10, wherein adapting the values of the plurality of coefficients of the SOVA detector further comprises adapting the values of the plurality of coefficients at least in part based on the indicator value.

12. The system of claim 1, wherein the criterion is a user-programmable criterion.

13. The system of claim 1, wherein the receiver is further configured to discard a previously stored output of the SOVA detector based on a discarding criterion.

14. The system of claim 13, wherein the discarding criterion comprises a latency associated with the decoded data pattern exceeding a predetermined threshold.

15. The system of claim 13, wherein the discarding criterion is based on a status or an intermediate result of an error-correcting code (ECC) decoder, and wherein the SOVA detector is coupled with the ECC decoder.

16. The system of claim 13, wherein the discarding criterion is based on a value for predicting a latency associated with the decoded data pattern.

17. The system of claim 1, wherein an order in which the stored selected output of the SOVA detector and a previously stored output of the SOVA detector are being used for the adaptation of the values of the plurality of coefficients is interchangeable based on a re-ordering criterion.

18. The system of claim 17, wherein the re-ordering criterion comprises a latency associated with the decoded data pattern exceeding a predetermined threshold.

19. The system of claim 17, wherein the re-ordering criterion is based on a status or an intermediate result of an error-correcting code (ECC) decoder, and wherein the SOVA detector is coupled with the ECC decoder.

20. The system of claim 17, wherein the re-ordering criterion is based on a value for predicting a latency associated with the decoded data pattern.

21. The system of claim 1, wherein the input to the SOVA detector is the signal.

22. The system of claim 1, wherein the input to the SOVA detector is derived from processing the signal with a data-dependent noise prediction (DDNP) module.

23. The system of claim 1, wherein the input to the SOVA detector is derived from passing the signal through an equalizer and a DDNP module.

24. The system of claim 1, wherein the decoded data pattern is an output from an error-correcting code (ECC) decoder, and wherein the SOVA detector is coupled with the ECC decoder.

25. The system of claim 24, wherein the ECC decoder is a low-density parity-check (LDPC) decoder.

26. The system of claim 1, wherein the decoded data pattern is a known data pattern.

27. The system of claim 1, further comprising adapting the values of a plurality of coefficients of a DDNP module at least in part based on the stored selected output of the SOVA detector, the stored signal, and a corresponding decoded data pattern, wherein the DDNP is coupled with the SOVA detector.

28. The system of claim 1, wherein the receiver includes a filtered output storage that is configured to store the selected output of the SOVA detector.

29. The system of claim 28, wherein the filtered output storage is configured to store the signal that corresponds to the stored selected output of the SOVA detector.

30. The system of claim 28, wherein the receiver further includes an ADC samples storage configured to store the signal that corresponds to the stored selected output of the SOVA detector.

31. A method for adapting values of coefficients of a soft output Viterbi algorithm (SOVA) detector, comprising:
selecting by a SOVA output filter an output of an SOVA detector at least in part based on a criterion;
storing the selected output of the SOVA detector;
storing a signal that corresponds to the stored selected output of the SOVA detector, wherein the input to the SOVA detector is derived from the signal; and
adapting values of a plurality of coefficients of the SOVA detector at least in part based on the stored selected output of the SOVA detector, the stored signal, and a corresponding decoded data pattern.

* * * * *